United States Patent
Lin et al.

(10) Patent No.: US 10,162,930 B2
(45) Date of Patent: Dec. 25, 2018

(54) METHOD OF ADJUSTING METAL LINE PITCH

(71) Applicant: TAIWAN SEMICONDUCTOR MANUFACTURING COMPANY LTD., Hsinchu (TW)

(72) Inventors: Wei-Cheng Lin, Taichung (TW); Kam-Tou Sio, Hsinchu County (TW); Shih-Wei Peng, Hsinchu (TW); Hui-Ting Yang', Hsinchu County (TW); Chih-Liang Chen, Hsinchu (TW); Jiann-Tyng Tzeng, Hsin Chu (TW); Chew-Yuen Young, Cupertino, CA (US); Chia-Tien Wu, Taichung (TW); Chih-Ming Lai, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 127 days.

(21) Appl. No.: 15/229,536

(22) Filed: Aug. 5, 2016

(65) Prior Publication Data
US 2018/0039723 A1    Feb. 8, 2018

(51) Int. Cl.
*G06F 17/50* (2006.01)

(52) U.S. Cl.
CPC .................. *G06F 17/5081* (2013.01)

(58) Field of Classification Search
USPC .......................................................... 716/111
See application file for complete search history.

(56) References Cited

U.S. PATENT DOCUMENTS

2015/0143319 A1* 5/2015 Lee ..................... G06F 17/5068
716/118

* cited by examiner

*Primary Examiner* — Bryce M Aisaka
(74) *Attorney, Agent, or Firm* — WPAT, P.C., Intellectual Property Attorneys; Anthony King

(57) ABSTRACT

A method performed by at least one processor comprises the operations of obtaining information on gate pitch and a ratio m:n between gate pitch and metal line pitch, m, n being a natural number and the ratio being in the simplest form, determining a unit pattern having a width of n times of the gate pitch, assigning m consecutive metal lines to the unit pattern, dividing the width of the unit pattern by m and obtaining a quotient (Q) and a remainder (R), determining an integer P so that a value of the remainder R divided by P satisfies a layout precision, and determining an inter-pattern metal line pitch and an intra-pattern metal line pitch based on Q and R/P.

20 Claims, 10 Drawing Sheets

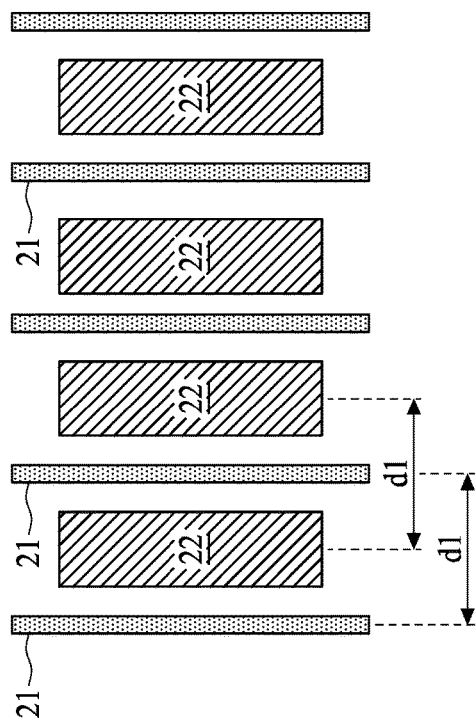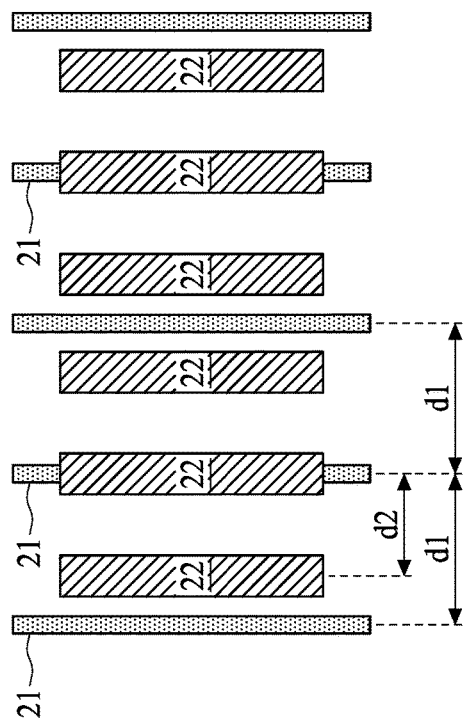

METHOD OF ADJUSTING METAL LINE PITCH

BACKGROUND

In several designs of semiconductor devices, the ratio between poly pitch and metal-1 (M1) line pitch is 1:1. That is, M1 pitch is equal to poly pitch. Since the value of poly pitch is usually a natural number, the value of M1 pitch is also a natural number. With the development in semiconductor technology, in advanced semiconductor designs, the ratio becomes greater than 1, for example, 3:2. Accordingly, M1 pitch is smaller than poly pitch. In that case, M1 may not be a whole number and hence may come with a decimal portion, which may not be acceptable due to limitation of layout precision. For example, in the case of the ratio of 3:2, M1 pitch is two thirds of poly pitch and may not be evenly divided by three (3).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are schematic diagrams illustrating semiconductor structures having different ratios between gate pitch and metal-1 (M1) pitch.

DETAILED DESCRIPTION

Figure 1:
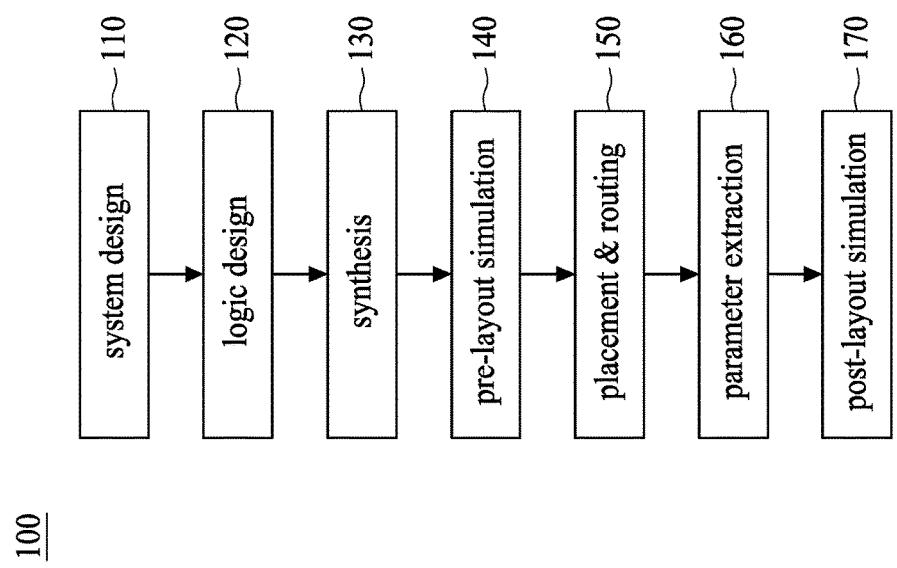
FIG. 1 is a schematic diagram illustrating a design flow in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram illustrating a design flow 100 in accordance with some embodiments. The design flow 100, employed for designing semiconductor chips, utilizes one or more electronic design automation (EDA) tools to facilitate design operations. A workstation or personal computer is used in executing the tools to accomplish the design flow 100. The design flow 100 comprises a system design stage 110, a logic design stage 120, a synthesis stage 130, a pre-layout simulation stage 140, a placement and routing stage 150, a parameter extraction stage 160 and a post-layout simulation stage 170.

Initially, at the system design stage 110, a systematic architecture for the chip of interest is provided with a high level description. In that stage, each function of the chip along with performance requirements is determined according to a design specification. Those functions are usually represented by respective schematic functional modules or blocks. In addition, an optimization or performance trade-off may be sought in order to achieve the design specification with affordable cost and power.

At the logic design stage 120, the functional modules or blocks are described in a register transfer level (RTL) using a hardware description language. The language tools are usually available from commercial software, for example, Verilog or VHDL. A preliminary functionality check is performed at the logic design stage 120 to verify if the implemented functions conform to the specification set forth in the system design stage 110.

Subsequently, at the synthesis stage 130, the modules in RTL descriptions are converted into a netlist data where circuit structure, for example, logic gates and registers, in each function module are established. Mapping of such logic gates and registers to available cells in a standard cell library may be conducted. Further, the netlist data is offered to describe the functional relationship of the chip devices in a gate-level. The netlist data is transformed from the gate-level view to a transistor-level view. The term "netlist" used herein refers to both graphical-based representation such as a schematic and/or a text-based representation of a circuit.

Then, the gate-level netlist data is verified at the pre-layout simulation stage 140. At the verification process of the stage 140, if some of the functions fail the verification in the simulation, the design flow 100 may be paused temporarily and go back to the stages 110 or 120 for further correction or modification. After the pre-layout simulation stage 140, the IC chip design has passed a preliminary verification and completed the front-end design process. Subsequently, a back-end physical design process will follow.

At the placement and routing stage 150, a physical architecture representing the circuits determined during the front-end process is implemented. The detailed structure and associated geometry of each component and device are determined in the placement operation, and interconnects among different components are routed subsequent to the placement operation. Moreover, the placement operation involves deciding where to place each IC chip component and circuitry in a limited amount of space, and the routing operation decides the actual wiring of connecting lines. Both operations of placement and routing are performed to meet a design rule check (DRC) deck, such as from the chip manufacturing facility, so as to fulfill the manufacturing criteria of the chip. After the placement and routing stage 150, a placed-and-routed layout data is created and a netlist with placement and routing data is generated accordingly.

At the parameter extraction stage 160, a layout parameter extraction (LPE) operation is conducted to derive layout-dependent parameters, such as parasitic resistance and capacitance, resulting from a developed layout at the stage 150. In some embodiments, before the layout parameter extraction operation, a layout-versus-schematic (LVS) verification is performed to check the functional performance of the chip in terms of the placed-and-routed netlist. Consequently, a post-layout netlist data is then generated, which includes the layout-dependent parameters.

At the post-layout simulation stage 170, a physical verification is performed by taking the parameters acquired in previous stages into account. At the stage 170, a simulation of transistor-level behavior is conducted in order to examine whether the chip performs the desired functionality within the required system specification. Moreover, the post-layout simulation is performed to ensure no presence of electrical issues or lithographic issues in the chip manufacturing process.

After the post-layout simulation stage 170, it is determined whether the post-layout netlist fulfills the design specification. If affirmative, the circuit design is accepted and then signed off accordingly. However, if the result of the post-layout simulation is unfavorable, the design flow 100 would loop back to previous stages for functionality or performance tuning. For example, the design flow 100 may loop back to the placement and routing stage 150 where the layout is re-developed so as to fix issues from the layout level. Alternatively, the design flow 100 may retreat to earlier stages; either the system design stage 110 or the logic design stage 120 in order to recast the chip design in case the problems cannot be resolved in the back-end stage.

The design flow 100 illustrated in FIG. 1 is exemplary. Other sequences of the stages or operations, partition of the stages, or additional stages before, between or after the stages shown still fall within the contemplated scope of the present disclosure.

In advanced semiconductor fabrications, for example, the 7-nanometer (N7) node or beyond, metal lines in metal-1 (M1) layer extend in parallel with metal gates and serve as pin access metals for electrical contact with corresponding metal gates. Moreover, the ratio of the distance between immediately adjacent metal gates (hereinafter the "gate pitch") to the distance between immediately adjacent M1 lines (hereinafter the "metal line pitch" or "M1 pitch") is greater than 1. For example, the ratio is raised from 1:1 to 3:2 or 4:3. As a result, the M1 pitch needs to be adjusted given the same gate pitch. To boost routing resources at the placement and routing stage 150, an effective way is to tighten M1 pitch. However, in the case that the ratio is 3:2 and gate pitch is not a multiple of three (3), M1 pitch is not evenly divisible by 3, which induces design and process problems. An alternative approach is to widen gate pitch to be a multiple of 3, which may inevitably increase cell area. However, an advanced semiconductor fabrication may not afford such area cost.

FIGS. 2A and 2B are schematic diagrams illustrating semiconductor structures having different ratios between gate pitch and metal-1 (M1) pitch. Specifically, FIG. 2A shows a ratio of 1:1 and FIG. 2B shows an exemplary ratio of 3:2. Referring to FIG. 2A, metal gates 21 extend in parallel with each other in a first direction and are separate from each other by a gate pitch d1. Further, metal lines 22 in the M1 layer also extend in parallel with each other in the first direction and are separate from each other by a metal pitch. The metal lines 22 in M1 layer are electrically coupled to metal gates 21 through conductive vias and serve as pin accesses for the metal gates 21. In some embodiments, the gate pitch is a center-to-center distance between two immediately adjacent gates 21 in a second direction substantially orthogonal to the first direction. Also, the M1 pitch is a center-to-center distance between two immediately adjacent metal lines 22 in the second direction. Moreover, the value of the gate pitch d1 is generally a natural number. In the present embodiment, the ratio of gate pitch to M1 pitch is 1:1. Accordingly, the M1 pitch is d1. Gate pitch may also be referred to as poly pitch when polysilicon is used as gate material. Nevertheless, gate material may be selected from other conductive materials including, for example, tantalum (Ta), tantalum nitride (TaN), niobium (Nb) and tungsten nitride/ruthenium oxide (WN/RuO2).

Referring to FIG. 2B, since the ratio is raised to 3:2, M1 pitch d2 is smaller than the gate pitch d1. Further, as shown in Table 1 below, when the gate pitch d1 is not a multiple of 3, d1 cannot be evenly divided by 3. As a result, the M1 pitch d2, which is two thirds (⅔) of the gate pitch d1, is not a whole number and has a recurring decimal portion. It may therefore be desirable to adjust the M1 pitch.

TABLE 1

| ratio of gate pitch to M1 pitch | | 3:2 | |
|---|---|---|---|
| gate pitch (nm) | 48 | 47 | 46 |
| M1 pitch (nm) | 32 | 31.3 | 30.6 |

Figure 3:
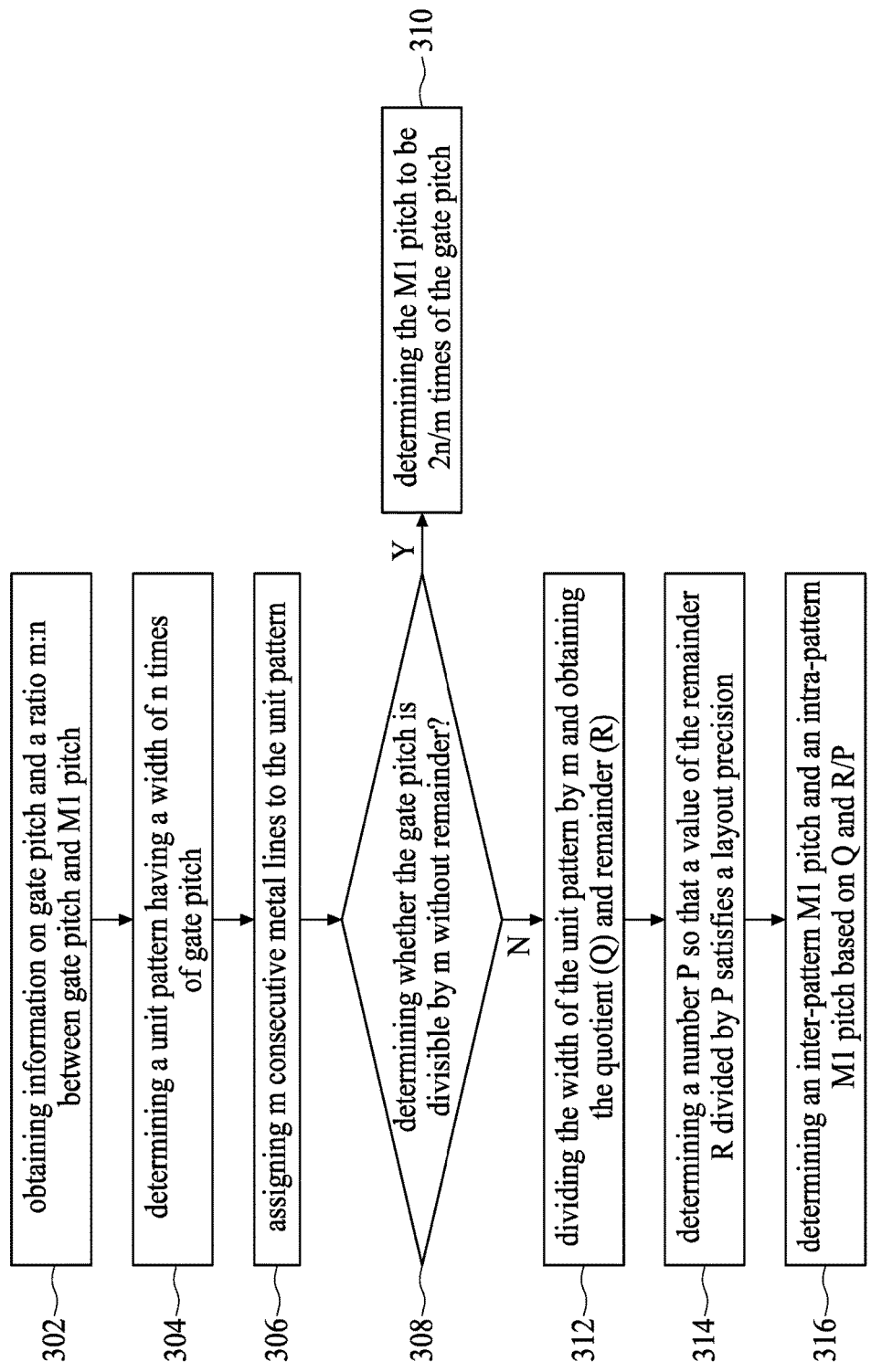
FIG. 3 is a flow diagram of a method of adjusting M1 pitch in accordance with some embodiments.

FIG. 3 is a flow diagram of a method of adjusting M1 pitch in accordance with some embodiments. Referring to FIG. 3, at operation 302, information on gate pitch and a ratio m:n between gate pitch and M1 pitch is obtained, in which m and n are natural numbers and the ratio is expressed in the simplest form. In an embodiment, the ratio is 3:2, while in another embodiment, the ratio is 4:3, which will be described in detail.

In operation 304, a unit pattern having a width of n times of gate pitch is determined. The unit pattern is repeated for a number of metal gates. Then, in operation 306, m consecutive M1 lines are assigned to the unit pattern. As a result, the m M1 lines are disposed within the n times of gate pitch. For example, given a gate pitch of 47 nm and a ratio of 3:2, the unit pattern has a width of 94 nm (47 nm×2) and three (3) M1 lines are disposed in unit pattern.

In operation 308, it is determined whether the gate pitch is divisible by m without remainder. If affirmative, in operation 310 the M1 pitch is determined to be 2n/m times of the gate pitch, as in the case shown in the above Table 1 when the gate pitch is 48 nm. If not divisible, the width of the unit pattern is divided by m to obtain the quotient (Q) and remainder (R) in operation 312. For example, given a ratio of 3:2, the quotient and remainder in the case of the 47 nm gate pitch are 31 and 1 nm, respectively, while in the case of the 46 nm gate pitch are 30 and 2 nm, respectively.

Next, in operation 314, a number P is determined so that a value of the remainder R divided by P satisfies a layout precision. In an embodiment, the layout precision is approximately 0.5 nm, which is observed in determining M1 pitch. For example, given a ratio of 3:2, since the remainders in the case of the 47 nm gate pitch and the 46 nm gate pitch are 1 nm and 2 nm, respectively, the numbers P are 2 and 4, respectively. The specific layout precision as mentioned above is exemplary only and is not intended to limit the scope of the present disclosure. For instance, in view of the increasingly smaller device feature, the layout precision may become smaller than 0.5 nm, for example, 0.25 nm.

Subsequently, in operation 316, an inter-pattern M1 pitch and an intra-pattern M1 pitch are determined based on the quotient Q and the layout precision R/P. The inter-pattern M1 pitch refers to a distance between an M1 line of one unit pattern and a M1 line of another unit pattern at an interface of the two unit patterns. The intra-pattern M1 pitch refers to a distance between two M1 lines in a same unit pattern.

Figure 4A:
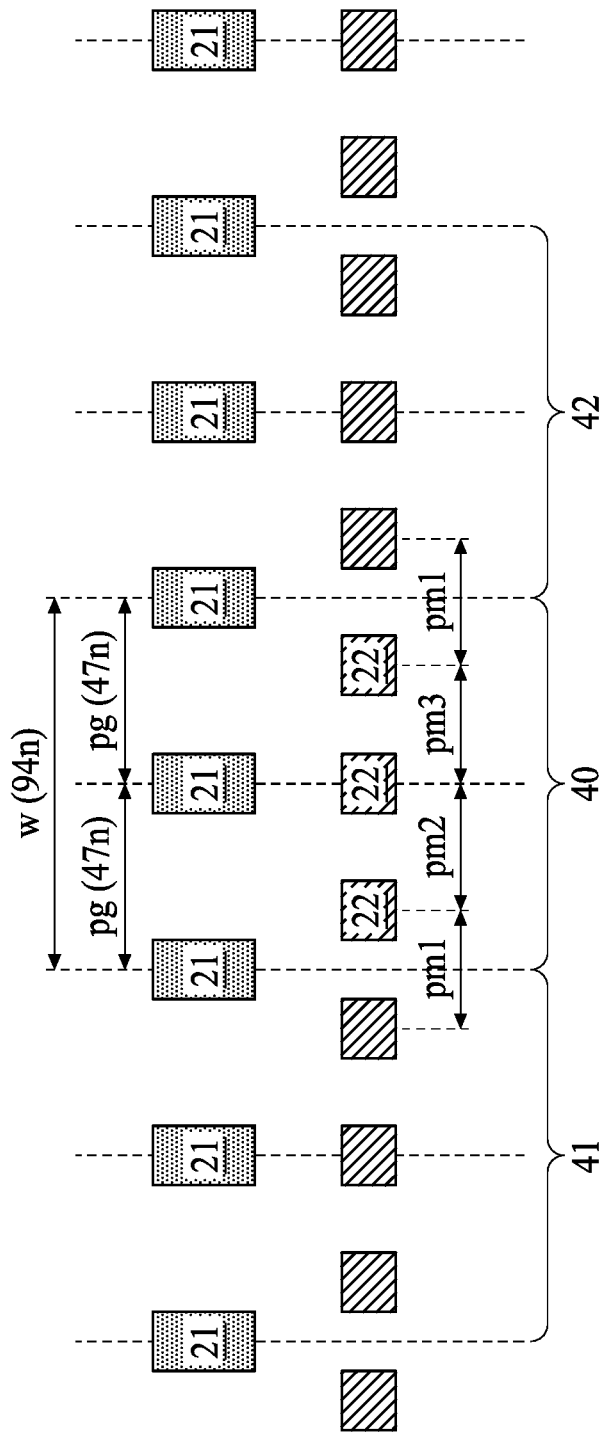
FIG. 4A is a schematic diagram of a layout in accordance with an embodiment.

FIG. 4A is a schematic diagram of a layout according to the method of FIG. 3 in accordance with an embodiment. Given a gate pitch (denoted as pg) of 47 nm and a ratio of 3:2, as previously discussed, an exemplary unit pattern 40 has a width (denoted as w) of 94 nm and three (3) M1 lines 22 are disposed in the unit pattern 40. Referring to FIG. 4A, the unit pattern 40 is immediately adjacent to unit patterns 41 and 42. Also referring to FIG. 3, the quotient Q and remainder R are determined to be 31 and 1 nm, respectively. Moreover, to meet the layout precision, the number P is determined to be 2. The value of P is two times that of the remainder R when the layout precision is 0.5 nm. The inter-pattern M1 pitch pm1 and intra-pattern M1 pitches pm2 and pm3 can be determined based on Q and R/P, and are summarized in Table 2 below.

TABLE 2

| ratio; gate pitch pg | m:n = 3:2; pg = 47 nm | type | pm1 ≠ pm2 = pm3 |
|---|---|---|---|
| unit pattern width w | pg × n = 47 × 2 nm | pm1 | (Q + R) ± nR/P = (Q + R) ± 2R/P |
| Q | 31 | pm2 | Q ∓ R/P |
| R | 1 | pm3 | Q ∓ R/P |
| P | 2 | (pm1, pm2, pm3) | (33, 30.5, 30.5) or (31, 31.5, 31.5) |

The inter-pattern M1 pitch pm1 and the intra-pattern M1 pitches pm2 and pm 3 can be calculated as follows.

$$pm1 = (Q+R) + R/P = (31+1) + 2 \times 0.5 = 33 \text{ (nm); and}$$

$$pm2 = pm3 = Q - R/P = 31 - 0.5 = 30.5 \text{ (nm)}$$

Alternatively, $pm1 = (Q+R) - R/P = (31+1) - 2 \times 0.5 = 30$ (nm); and $$pm2 = pm3 = Q + R/P = 31 + 0.5 = 31.5 \text{ (nm)}$$

In the embodiment shown in Table 2, the intra-pattern M1 pitches pm2 and pm 3 are equal. In other embodiments, the intra-pattern M1 pitches pm2 and pm 3 may be different, as shown in Table 3 and Table 4 below.

TABLE 3

| ratio/gate pitch pg | 3:2/47 nm | type | pm1 = pm2 ≠ pm3 |
|---|---|---|---|
| unit pattern width w | 47 × 2 | pm1 | Q ∓ R/P |
| Q | 31 | pm2 | Q ∓ R/P |
| R | 1 | pm3 | (Q + R) ± 2R/P |
| P | 2 | (pm1, pm2, pm3) | (30.5, 30.5, 33) or (31.5, 31.5, 31) |

TABLE 4

| ratio/gate pitch pg | 3:2/47 nm | type | pm1 = pm3 ≠ pm3 |
|---|---|---|---|
| unit pattern width w | 47 × 2 | pm1 | Q ∓ R/P |
| Q | 31 | pm2 | (Q + R) ± 2R/P |
| R | 1 | pm3 | Q ∓ R/P |
| P | 2 | (pm1, pm2, pm3) | (30.5, 33, 30.5) or (31.5, 31, 31.5) |

In still other embodiments, the layout precision portion R/P is rounded down so that the values of pm1, pm2 and pm3 are natural numbers, which inherently satisfy the requirement for layout precision. The possible M1 pitches according to the method are summarized in Table 5 below.

TABLE 5

| type | pm1 ≠ pm2 = pm3 | | | pm1 = pm2 ≠ pm3 | | | pm1 = pm3 ≠ pm3 | | |
|---|---|---|---|---|---|---|---|---|---|
| pm1 | 31 | 32 | 33 | 31.5 | 31 | 30.5 | 31.5 | 31 | 30.5 |
| pm2 | 31.5 | 31 | 30.5 | 31.5 | 31 | 30.5 | 31 | 32 | 33 |
| pm3 | 31.5 | 31 | 30.5 | 31 | 32 | 33 | 31.5 | 31 | 30.5 |

In an embodiment, the difference among the intra-pattern and inter-pattern M1 pitches is not greater than the layout precision, which may facilitate chip fabrication. Accordingly, given the gate pitch of 47 nm and the ratio of 3:2, the intra-pattern and inter-pattern M1 pitches are 31 or 31.5 nm and at least one of them is different from the others.

Figure 4B:
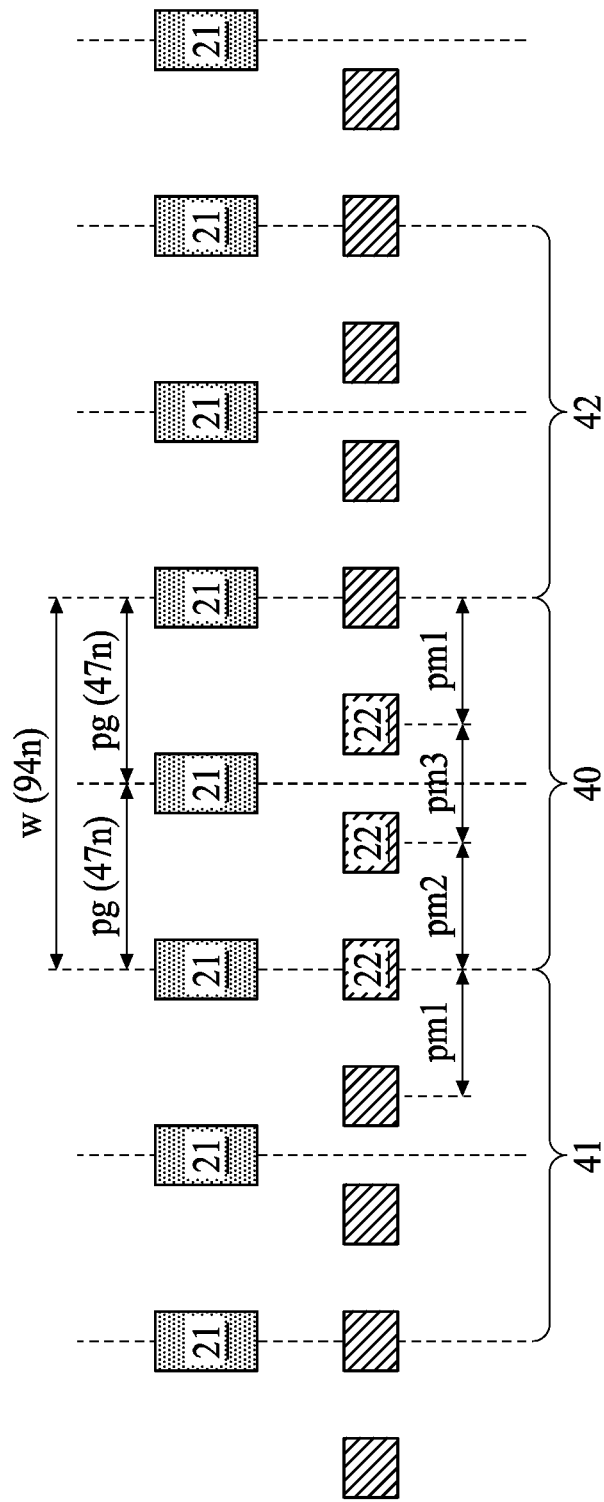
FIG. 4B is a schematic diagram of a layout in accordance with another embodiment.

In the embodiment shown in FIG. 4A, the metal lines 22 are disposed within the width of the unit pattern 40. FIG. 4B is a schematic diagram of a layout according to the method of FIG. 3 in accordance with another embodiment. Referring to FIG. 4B, the arrangement of metal lines, including the intra-pattern and inter-pattern M1 pitches, is similar to that in FIG. 4A except that, for example, one of the metal lines 22 overlaps the interface between the unit pattern 40 and an adjacent unit pattern 41 or 42. After the intra-pattern M1 pitch and inter-pattern M1 pitch are determined, a netlist data including such information is generated to facilitate subsequent verification and simulation at the stages 160 and 170 as described and illustrated with reference to FIG. 1.

Figure 5:
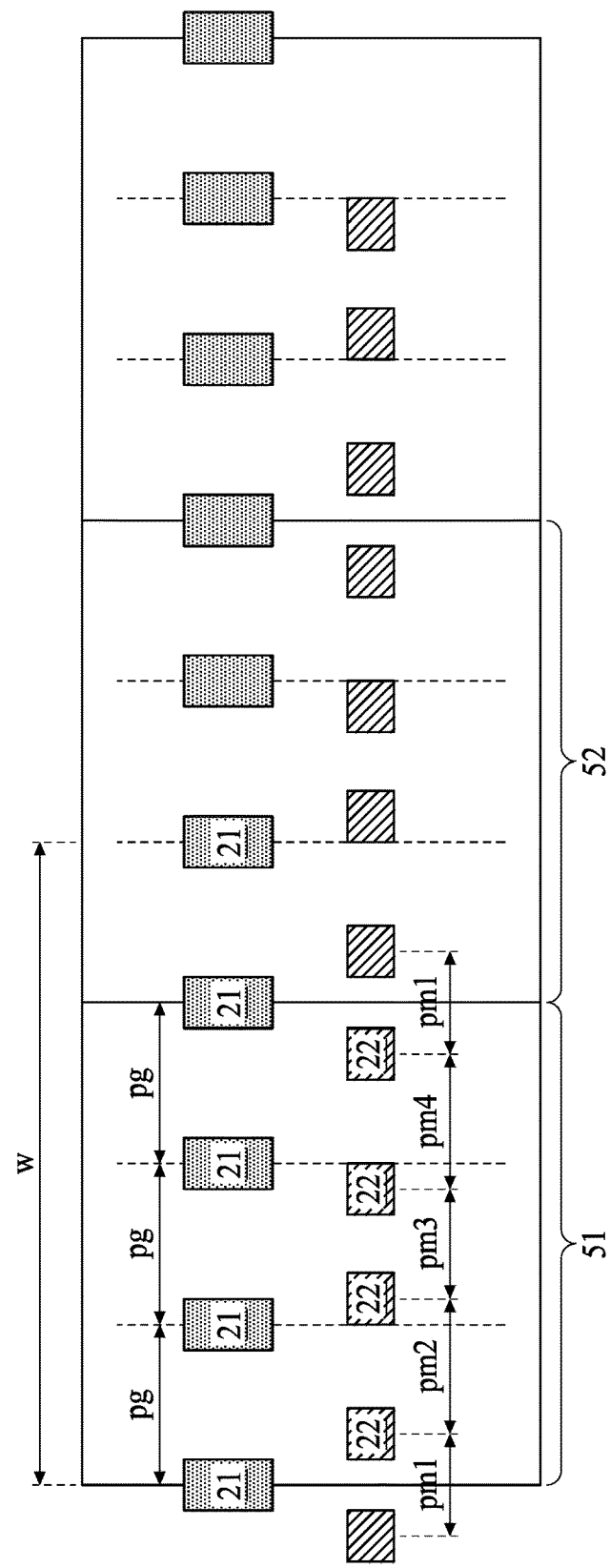
FIG. 5 is a schematic diagram of a layout in accordance with still another embodiment.

FIG. 5 is a schematic diagram of a layout in accordance with still another embodiment. Referring to FIG. 5, the layout is similar to that of FIG. 4A except that, for example, the ratio is 4:3. Given a gate pitch of 45 nm and the ratio of 4:3, also referring to FIG. 3, an exemplary unit pattern 51 has a width of 135 nm and four (4) M1 lines 22 are disposed in the unit pattern 52. The unit pattern 51 is immediately adjacent to, for example, a unit pattern 52. Furthermore, the quotient Q and remainder R are determined to be 33 and 3 nm, respectively. Moreover, to meet the layout precision, the number P is determined to be 6. The inter-pattern M1 pitch pm1 and intra-pattern M1 pitches pm2, pm3 and pm4 can be determined based on Q and R/P, and are summarized in Table 6 below.

TABLE 6

| ratio | m:n = 4:3 | type | pm1 ≠ pm2 = pm3 = pm4 |
|---|---|---|---|
| gate pitch pg | pg = 45 nm | pm1 | (Q + R) ± nR/P = (Q + R) ± 3R/P |
| unit pattern width w | pg × n = 45 × 3 nm | pm2 | Q ∓ R/P |
| Q | 33 | pm3 | Q ∓ R/P |
| R | 3 | pm4 | Q ∓ R/P |
| P | 6 | (pm1, pm2, pm3, pm4) | (34.5, 33.5, 33.5, 33.5) |

In the embodiment shown in Table 6, the intra-pattern M1 pitches pm2, pm3 and pm 4 are equal. In other embodiments, the intra-pattern M1 pitches pm2, pm3 and pm 4 may be different. For example, the intra-pattern M1 pitches pm3 and pm 4 and the inter-pattern M1 pitch pm1 are 33.5 nm, while the intra-pattern M1 pitch pm2 is 34.5 nm.

In yet another embodiment, given a gate pitch of 46 nm and the ratio of 4:3, a unit pattern has a width of 138 nm and four (4) M1 lines 22 are disposed in the unit pattern. Also referring to FIG. 3, the quotient Q and remainder R are determined to be 34 and 2 nm, respectively. Moreover, to meet the layout precision, the number P is determined to be 4. The inter-pattern M1 pitch pm1 and intra-pattern M1 pitches pm2, pm3 and pm4 can be determined based on Q and R/P, and are summarized in Table 7 below.

TABLE 7

| ratio | m:n = 4:3 | type | pm1 = pm 2 ≠ pm3 = pm4 |
|---|---|---|---|
| gate pitch pg | pg = 46 nm | pm1 | (Q + R/2) ± nR/ P = (Q + R) ± 3R/P |
| unit pattern width w | pg × n = 46 × 3 nm | pm2 | (Q + R/2) ± nR/ P = (Q + R) ± 3R/P |
| Q | 34 | pm3 | Q ∓ R/P |
| R | 2 | pm4 | Q ∓ R/P |
| P | 4 | (pm1, pm2, pm3, pm4) | (34.5, 34.5, 33.5, 33.5) |

In the embodiment shown in Table 7, the intra-pattern M1 pitches pm2 and pm3 are not equal. In other embodiments, the intra-pattern M1 pitches pm2 and pm3 and pm 4 are equal. For example, using the adjustment type: pm1#pm2=pm3=pm4, the intra-pattern M1 pitches pm2, pm3 and pm 4 are 34.5 nm, while the inter-pattern M1 pitch pm1 is also 34.5 nm.

Figure 6:
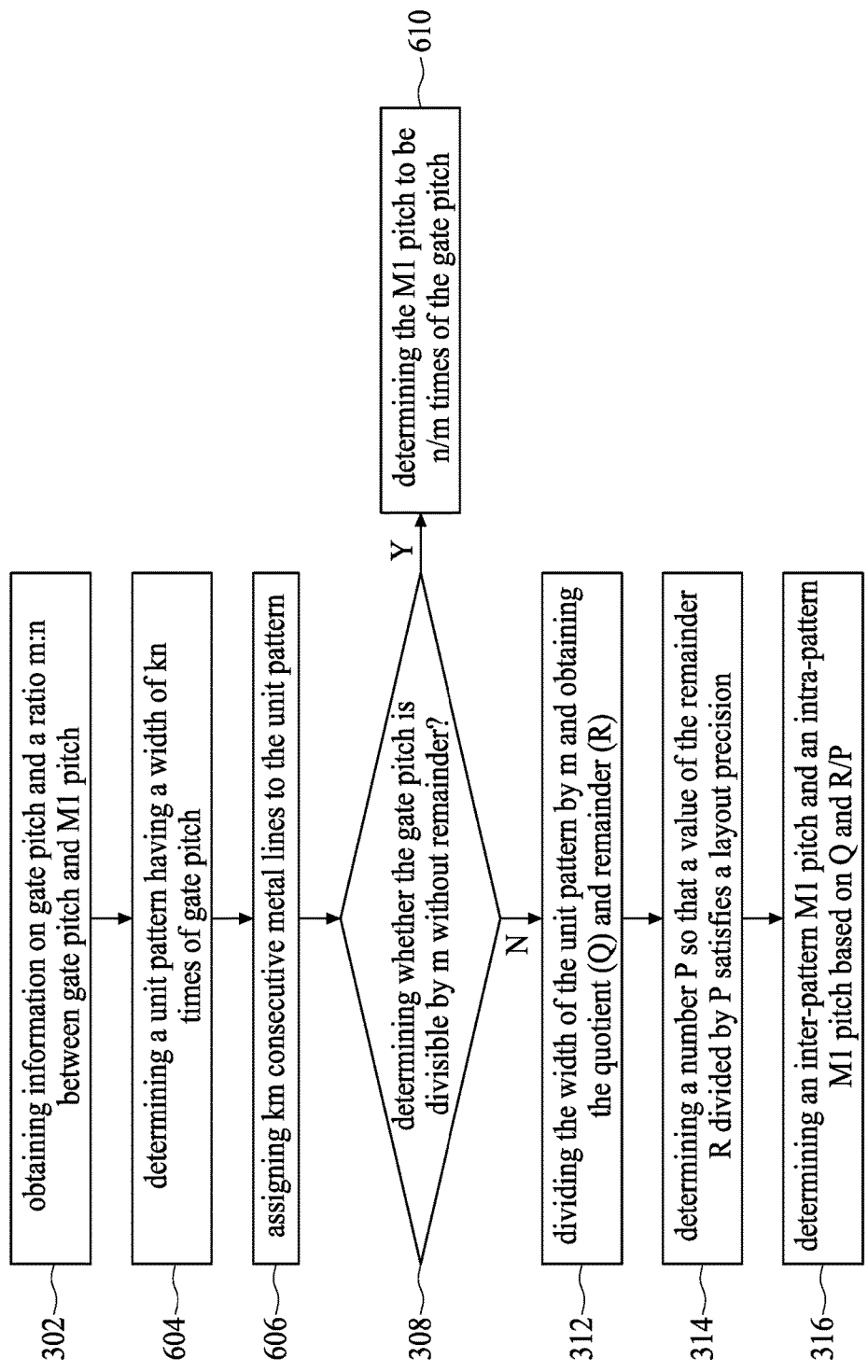
FIG. 6 is a flow diagram of a method of adjusting M1 pitch in accordance with some embodiments.

FIG. 6 is a flow diagram of a method of adjusting M1 pitch in accordance with some embodiments. Referring to FIG. 6, the method is similar to that described and illustrated with reference to FIG. 3 except, for example, operations 604 and 606. The ratio in the method of FIG. 6 is the same as that of FIG. 3. However, the ratio 3:2 in the simplest form in FIG. 3 is expanded to 6:4 in FIG. 6. In operation 604, a unit pattern having a width of kn times of gate pitch is determined, k being a natural number. In the case of expansion to 6:4, the value of k is two (2). Accordingly, the width of a unit pattern is two times that of the unit pattern 40 in FIG. 4A. Next, in operation 606, km metal lines are assigned to the unit pattern. If the gate pitch is divisible by the denominator m in operation 308, then in operation 610 the M1 pitch is determined to be n/m times of the gate pitch. If not divisible, same operations 312 to 316 as in the method of FIG. 3 are performed. The method of FIG. 6 is explained in detail with reference to FIG. 7.

Figure 7:
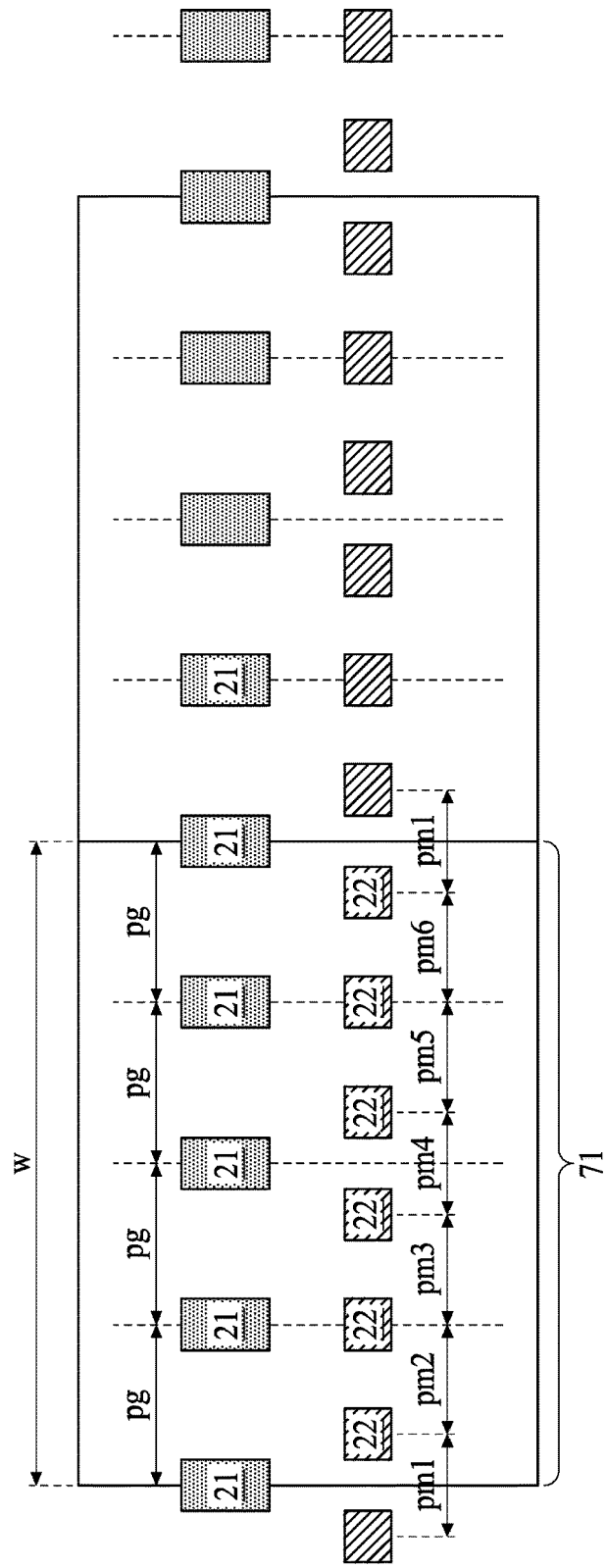
FIG. 7 is a schematic diagram of a layout in accordance with still another embodiment.

FIG. 7 is a schematic diagram of a layout in accordance with still another embodiment. Given a gate pitch pg of 47 nm and an expanded ratio of 6:4, an exemplary unit pattern 71 has a width w of 168 nm and six (6) M1 lines 22 are disposed in the unit pattern 71. The quotient Q and remainder R are determined to be 31 and 2 nm, respectively. Moreover, to meet the layout precision, the number P is determined to be 4. The inter-pattern M1 pitch pm1 and intra-pattern M1 pitches pm2 to pm6 can be determined based on Q and R/P, and are summarized in Table 8 below.

TABLE 8

| ratio | m:n = 3:2 | type | pm1 = pm5 ≠ pm2 = pm3 = pm4 = pm6 |
|---|---|---|---|
| expanded ratio | m':n' = 6:4 | pm1, pm5 | (Q + R) ± n'R/ P = (Q + R) ± 4R/P |
| gate pitch pg | pg = 46 nm | pm2 | Q ∓ R/P |
| unit pattern width w | pg × n = 46 × 3 nm | pm3 | Q ∓ R/P |
| Q | 34 | pm4 | Q ∓ R/P |
| R | 2 | pm6 | Q ∓ R/P |
| P | 4 | (pm1, pm2, pm3, pm4, pm5, pm6) | (31, 31.5, 31.5, 31.5, 31.5, 31, 31.5) |

The adjustment type in Table 8 is exemplary. Other adjustment types that adjust inter-pattern and intra-pattern metal line pitches according to a desired layout precision fall within the contemplated scope of the present disclosure.

Figure 8:
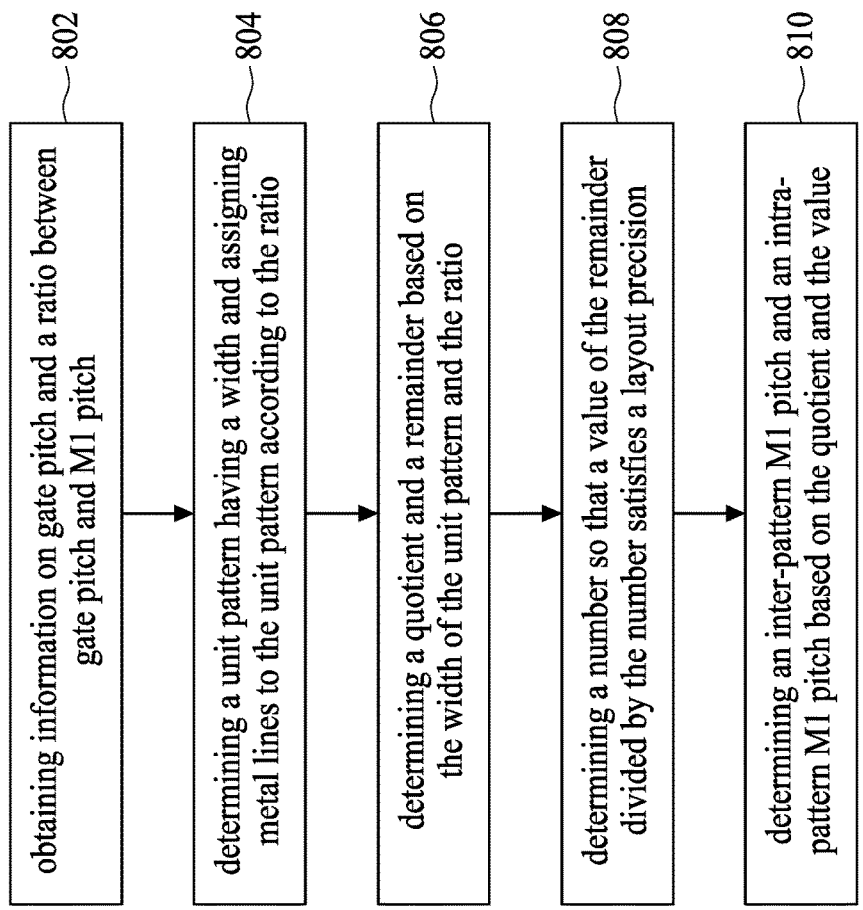
FIG. 8 is a flow diagram of a method of adjusting M1 pitch in accordance with some embodiments.

FIG. 8 is a flow diagram of a method of adjusting M1 pitch in accordance with some embodiments. The method is similar to that described and illustrated with reference to FIG. 3 or FIG. 5 except that, for example, no matter whether a gate pitch is divisible, inter-pattern and intra-pattern metal line pitches are determined. Referring to FIG. 8, in operation 802, information on gate pitch and a ratio between gate pitch and M1 pitch is obtained. In operation 804, a unit pattern having a width is determined, and metal lines are assigned to the unit pattern according to the ratio. In operation 806, a quotient and a remainder based on the width of the unit pattern and the ratio are determined. Next, in operation 808, a number is determined to ensure that a value of the remainder divided by the number satisfies a layout precision. Subsequently, an inter-pattern M1 pitch and an intra-pattern M1 pitch based on the quotient and the value are determined. Afterwards, a netlist data including information on the inter-pattern M1 pitch and the intra-pattern M pitch is generated.

The method according to the present disclosure enables the adjustment of inter-pattern M1 pitch and the intra-pattern M1 pitch without compromising chip area and thus can boost routing resources and facilitate a cost effective design.

Figure 9:
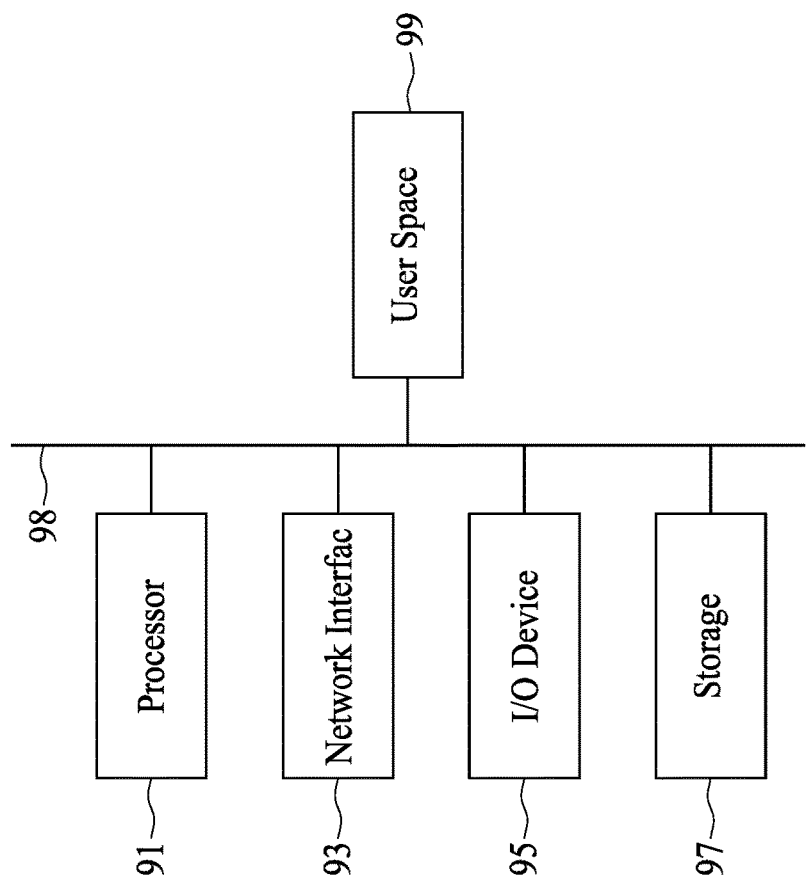
FIG. 9 is a block diagram of a system in accordance with some embodiments.

FIG. 9 is a block diagram of a system 90 for placement and routing in accordance with some embodiments. Referring to FIG. 9, a system 90 includes a processor 91, a network interface 93, an input and output (I/O) device 95, a storage 97, a memory 99, and a bus 98. The bus 98 couples the network interface 93, the I/O device 95, the storage 97 and the memory 99 to the processor 91.

The processor 91 is configured to execute program instructions that include a tool configured to perform a method as described and illustrated with reference to FIG. 3, 5 or 8. Moreover, the tool is configured to perform the method for determining inter-pattern metal line pitch and intra-pattern metal line pitch as described and illustrated with reference to FIGS. 4A, 4B, 5 and 7. Accordingly, the tool is configured to execute the operations including obtaining information on gate pitch and a ratio between gate pitch and metal line pitch, determining, according to the ratio between gate pitch and metal line pitch, a unit pattern having a width, assigning metal lines to the unit pattern according to the ratio between gate pitch and metal line pitch, determining a quotient and a remainder based on the width of the unit pattern and the ratio between gate pitch and metal line pitch, determining a number so that a value of the remainder divided by the number satisfies a layout precision, determining an inter-pattern metal line pitch and an intra-pattern metal line pitch based on the value, and generating a netlist data including information on the inter-pattern metal line pitch and the intra-pattern metal line pitch.

The network interface 93 is configured to access program instructions and data accessed by the program instructions stored remotely through a network (not shown).

The I/O device 95 includes an input device and an output device configured for enabling user interaction with the system 90. In some embodiments, the input device comprises, for example, a keyboard, a mouse, and other devices. Moreover, the output device comprises, for example, a display, a printer, and other devices.

The storage device 97 is configured for storing program instructions and data accessed by the program instructions. In some embodiments, the storage device 97 comprises, for example, a magnetic disk and an optical disk.

The memory 99 is configured to store program instructions to be executed by the processor 91 and data accessed by the program instructions. In some embodiments, the memory 99 comprises a random access memory (RAM) and/or some other volatile storage device and/or read only memory (ROM) and/or some other non-volatile storage device.

In some embodiments, the present disclosure provides a method performed by at least one processor. The method comprises obtaining information on gate pitch and a ratio m:n between gate pitch and metal line pitch, m, n being a natural number and the ratio being in the simplest form, determining a unit pattern having a width of n times of the gate pitch, assigning m consecutive metal lines to the unit pattern, dividing the width of the unit pattern by m and obtaining a quotient (Q) and a remainder (R), determining an integer P so that a value of the remainder R divided by P satisfies a layout precision, and determining an inter-pattern metal line pitch and an intra-pattern metal line pitch based on Q and R/P.

In some embodiments, the present disclosure also provides a method performed by at least one processor. The method comprises obtaining information on gate pitch and a ratio m:n between gate pitch and M1 pitch, m, n being a natural number and the ratio being in the simplest form, determining a unit pattern having a width of kn times of gate pitch, k being a natural number, assigning km consecutive metal lines to the unit pattern, determining a quotient and a remainder based on the width of the unit pattern and the ratio between gate pitch and metal line pitch, determining a number to ensure that a value of the remainder divided by the number satisfies a layout precision, and determining an inter-pattern metal line pitch and an intra-pattern metal line pitch based on the quotient and the value.

In some embodiments, the present disclosure provides a system that comprises one or more processors and one or more programs including instructions which, when executed by the one or more processors, cause the system to obtain information on gate pitch and a ratio between gate pitch and metal line pitch, determine, based on the layout data, heat-related parameters for the transistors, determine, according to the ratio between gate pitch and metal line pitch, a unit pattern having a width, assign metal lines to the unit pattern according to the ratio between gate pitch and metal line pitch, determine a quotient and a remainder based on the width of the unit pattern and the ratio between gate pitch and metal line pitch, determine a number so that a value of the remainder divided by the number satisfies a layout precision, and determine an inter-pattern metal line pitch and an intra-pattern metal line pitch based on the quotient and the value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, performed by at least one processor, comprising:
   obtaining information on gate pitch and a ratio m:n between gate pitch and M1 pitch, m, n being a natural number and the ratio being in the simplest form;
   determining a unit pattern having a width of kn times of gate pitch, k being a natural number;
   determining a quotient and a remainder based on the width of the unit pattern and the ratio between gate pitch and metal line pitch;
   determining a number to ensure that a value of the remainder divided by the number satisfies a layout precision;
   determining an inter-pattern metal line pitch and an intra-pattern metal line pitch based on the quotient and the value; and
   disposing km consecutive metal lines within the width of the unit pattern according to the inter-pattern metal line pitch and the intra-pattern metal line pitch.

2. The method according to claim 1 further comprising generating a netlist data including information on the inter-pattern metal line pitch and the intra-pattern metal line pitch.

3. The method according to claim 1, wherein the ratio between gate pitch and metal line pitch is 3:2 or 4:3.

4. The method according to claim 1, wherein the metal line belongs to metal-1 (M1) layer.

5. The method according to claim 1 further comprising, after the assigning, determining whether the gate pitch is divisible by m.

6. The method according to claim 5 further comprising determining the metal pitch to be n/m times of the gate pitch if the gate pitch is divisible by m.

7. The method according to claim 1, wherein the layout precision is 0.5 nanometer.

8. The method according to claim 7, wherein the value of the number is two times that of the remainder.

9. A method for metal line disposition, comprising:
   obtaining information on gate pitch and a ratio m:n between gate pitch and metal line pitch, m, n being a natural number and the ratio being in the simplest form;
   determining a plurality of unit patterns each having a width of n times of the gate pitch;
   determining a quotient and a remainder based on the width of the unit pattern and the ratio between gate pitch and metal line pitch;
   determining a number to ensure that a value of the remainder divided by the number satisfies a layout precision; and
   determining an inter-pattern metal line pitch and an intra-pattern metal line pitch based on the quotient and the value; and disposing m consecutive metal lines within each unit pattern according to the inter-pattern metal line pitch and the intra-pattern metal line pitch.

10. The method according to claim 9 further comprising generating a netlist data including information on the inter-pattern metal line pitch and the intra-pattern metal line pitch.

11. The method according to claim 9, wherein the ratio between gate pitch and metal line pitch is 3:2 or 4:3.

12. The method according to claim 9, wherein the metal line belongs to metal-1 (M1) layer.

13. The method according to claim 9, wherein determining the quotient and the remainder based on the width of the unit pattern and the ratio between gate pitch and metal line pitch comprises determining whether the gate pitch is divisible by m.

14. The method according to claim 13 further comprising determining the metal pitch to be n/m times of the gate pitch if the gate pitch is divisible by m.

15. The method according to claim 9, wherein the layout precision is 0.5 nanometer.

16. The method according to claim 15, wherein the value of the number is two times that of the remainder.

17. A system, comprising one or more processors and one or more programs including instructions which, when executed by the one or more processors, cause the system to:

obtain information on gate pitch and a ratio between gate pitch and metal line pitch;

determine, according to the ratio between gate pitch and metal line pitch, a unit pattern having a width;

determine a quotient and a remainder based on the width of the unit pattern and the ratio between gate pitch and metal line pitch;

determine a number to ensure that a value of the remainder divided by the number satisfies a layout precision;

determine an inter-pattern metal line pitch and an intra-pattern metal line pitch based on the quotient and the value; and disposing metal lines within the width of the unit pattern according to the inter-pattern metal line pitch and the intra-pattern metal line pitch.

18. The system according to claim 17 further comprising instructions which, when executed by the one or more processors, cause the system to generate a netlist data including information on the inter-pattern metal line pitch and the intra-pattern metal line pitch.

19. The system according to claim 17, wherein the ratio between gate pitch and metal line pitch is 3:2 or 4:3.

20. The system according to claim 19, wherein the ratio is expanded by k in determining the width of the unit pattern, k being a natural number.

* * * * *